United States Patent
Endo et al.

(10) Patent No.: US 6,495,022 B2
(45) Date of Patent: Dec. 17, 2002

(54) METHOD OF PRODUCING COPPER FOIL FOR FINE WIRING

(75) Inventors: Yasuhiro Endo, Shimodate (JP); Hiroki Hara, Yamanashi (JP); Nobuchika Yagihashi, Shimodate (JP)

(73) Assignee: Nippon Denkai, Ltd., Tokyo (JP)

( * ) Notice: Subject to any disclaimer, the term of this patent is extended or adjusted under 35 U.S.C. 154(b) by 0 days.

(21) Appl. No.: 09/953,911

(22) Filed: Sep. 18, 2001

(65) Prior Publication Data

US 2002/0053517 A1 May 9, 2002

(30) Foreign Application Priority Data

Sep. 18, 2000 (JP) .......................................... 2000-281635

(51) Int. Cl.$^7$ .............................. C25D 5/10; C25D 5/00; C25D 5/12
(52) U.S. Cl. ........................ 205/176; 205/111; 205/177; 205/181; 205/182
(58) Field of Search ................................ 205/182, 176, 205/177, 181, 111

(56) References Cited

U.S. PATENT DOCUMENTS 6,117,536 A * 9/2000 Poutasse ................... 428/301.1

* cited by examiner

*Primary Examiner*—Edna Wong
(74) *Attorney, Agent, or Firm*—Antonelli, Terry, Stout & Kraus, LLP

(57) ABSTRACT

A copper foil for fine wiring is produced by forming on a bonding surface of a copper foil a composite metal layer comprising (I) copper, (II) at least one of tungsten and molybdenum and (III) at least one of nickel, cobalt, iron and zinc by carrying out electrolysis in a plating bath (A) containing ions of these metals and chloronium ions, and then forming a roughened layer comprising copper on the composite metal layer by carrying out electrolysis in a plating bath (B) containing copper ions at a current density not lower than a limiting current density of the plating bath to form a dendritic copper electrodeposition layer and then carrying out subsequent electrolysis at a current density lower than the limiting current density of plating bath to form nodular copper.

2 Claims, 1 Drawing Sheet

METHOD OF PRODUCING COPPER FOIL FOR FINE WIRING

BACKGROUND OF THE INVENTION (a) Field of the Invention

The present invention relates to a method of producing a copper foil for fine wiring, which has a bonding surface uniformly roughened to a low surface roughness, has good etching properties, enables high density fine wiring and also adheres strongly to base materials.

(b) Description of the Related Art

The bonding surface of copper foil for printed wiring boards is generally roughened by some means previous to lamination onto resin base materials, to increase adhesive strength. Plating methods have been mainly used for roughening electrolytic copper foil. Japanese Patent Application Examined Publication No. 53-39376 (1978) discloses an example of the plating methods. According to the method, first a dendritic copper electrodeposition layer is formed on at least one bonding surface of a copper foil as a cathode by the so-called burning plating in an acidic copper plating bath at a current of the limiting current density or higher, then a smooth copper electrodeposition layer is formed on the dendritic copper electrodeposition layer at a current of a current density lower than the limiting current density (covering plating) to change the dendritic copper into nodular copper and to increase the adhesive strength by the nodular copper. After the formation of the nodular copper, the surface of the copper foil has a larger specific surface than before the electrolysis treatment, and the nodular copper works as an anchor to increase the adhesive strength between resin base materials and the copper foil. When nodular copper is formed on electrolytic copper foil, which generally has a surface (mat surface) rougher than the other surface (shiny surface), current is mainly centered to convexes, and the formation of the nodular copper is centered on the extreme tops of the convexes.

With the recent spread of note type personal computers and pocket telephones, the wiring pattern of printed wiring boards fabricated therein has become increasingly denser and finer to a degree of circuit width and space of 100 $\mu$m or less. The use of glass-epoxy printed wiring boards produced by using as resin base materials FR-5 materials having high Tg's has also been increased. As compared with conventional FR-4 materials, epoxy resins having high Tg's are more resistive to heat but have lower adhesive strength to copper foil. A means of enhancing the adhesive strength of copper foil to resin base materials is to increase the roughness of the bonding surface of copper foil. However, increasing the surface roughness tends to cause the so-called copper powder-falling off that is the falling of nodular copper even with small abrasion force and the so-called residual copper that is nodular copper left in resin base materials after the etching step in the production of printed circuits.

Japanese Patent Application Examined Publication No. 54-38053 (1979) discloses an improved method of forming a roughened surface by carrying out electrolysis treatment at an approximate limiting current density in an acidic copper plating bath to which a specific amount of at least one metal selected from arsenic, antimony, bismuth, selenium and tellurium is added. Minute projections can be formed by adding a very small amount of arsenic, antimony, bismuth, selenium or tellurium, but are still centered to the convexes on the copper foil. Further, printed wiring boards using the copper foil containing arsenic, antimony, bismuth, selenium or tellurium, which are poisons or deadly poisons, cause environmental pollution on discarding etching waste liquors or the printed wiring boards themselves.

The addition of benzoquinoline to an acidic copper plating bath (Japanese Patent Application Examined Publication No. 56-41196 (1981)) and the addition of molybdenum (Japanese Patent Application Examined Publication No. 62-56677 (1987)) are also proposed, but cannot improve adhesive strength sufficiently.

Japanese patent Application Unexamined Publication No. 8-236930 (1996) discloses a method for solving the problem, wherein electrolysis is carried out at approximate limiting current density in an acidic copper plating bath containing metal ions of at least one metal selected from chromium and tungsten and metal ions of at least one metal selected from vanadium, nickel, iron, cobalt, zinc, germanium and molybdenum, to form a roughening-treated layer containing the metals added. Japanese Patent Application Unexamined Publication No. 11-256389 (1999) discloses a method of carrying out electrolysis at approximate limiting current density in an acidic copper plating bath containing molybdenum ions and metal ions of at least one metal selected from iron, cobalt, nickel and tungsten, to form a layer of burnt deposits (a layer formed by burning plating) containing the metals added.

These methods, however, also cause the phenomena of copper powder-falling off and residual copper, because nodular copper is formed exclusively on the extreme tops of the convexes on raw copper foil.

Etching factor (Ef) is a measure of the etching properties of copper-clad laminates. FIG. 1 is an illustrative sectional view of a circuitized copper foil for explaining etching factor (Ef), wherein a circuitized copper foil A is formed on an electrically insulating base material B by etching a copper foil. When the top width of the circuitized copper foil is WT, the bottom width of the circuitized copper foil is WB and the thickness of the circuitized copper foil is H, Ef=2H/(WB−WT). Circuit patterns having larger Ef have walls that are nearer perpendicular. To make finer wiring, it is preferable to use copper foil having larger Ef.

Ef depends on the thickness of copper foil, the surface roughness of the bonding surface of copper foil or the like. Ef decreases with the increase of the surface roughness of the bonding surface, because the projections on the roughened surface of the copper foil dig into base materials, and necessitate elongated etching time to completely remove them and damage the patterned circuit shape due to the excessively etched circuit walls. If the projections of the roughened surface are not etched off completely, the copper particles remaining in the base materials may cause disconnection or insulation failure in narrowly spaced fine wiring.

Fine wiring, therefore, requires copper foil, which has a uniformly roughened bonding surface of low surface roughness, good etching properties and a high adhesive strength to base materials.

SUMMARY OF THE INVENTION

The object of the present invention is to provide a copper foil for fine wiring, which has a uniformly roughened bonding surface of a low surface roughness, does not decrease the adhesive strength between the copper foil and resin base materials, has a high etching factor and can be finely patterned without leaving copper particles in base materials.

Accordingly, the present invention provides a method of producing a copper foil for fine wiring, comprising treating a copper foil as a cathode by electrolysis in a plating bath (A) containing (1) copper ions, (2) metal ions of at least one metal selected from the group consisting of tungsten and molybdenum, (3) metal ions of at least one metal selected from the group consisting of nickel, cobalt, iron and zinc and (4) 1 to 100 mg/l of chloronium ions, at a current density lower than a limiting current density of the plating bath (A), to form on a bonding surface of the copper foil a composite metal layer comprising (I) copper, (II) at least one metal selected from the group consisting of tungsten and molybdenum and (III) at least one metal selected from the group consisting of nickel, cobalt, iron and zinc; and forming a roughened layer comprising copper on the composite metal layer by carrying out electrolysis in a plating bath (B) containing copper ions at a current density not lower than a limiting current density of the plating bath (B) to form a dendritic copper electrodeposition layer and then carrying out subsequent electrolysis at a current density lower than the limiting current density of the plating bath (B) to form nodular copper.

Herein, the terms "the limiting current density of the plating bath" mean a current density at which the generation of hydrogen accompanies the cathode reaction for the deposition of the metals or metal compounds.

DESCRIPTION OF THE PREFERRED EMBODIMENTS

Figure 1:
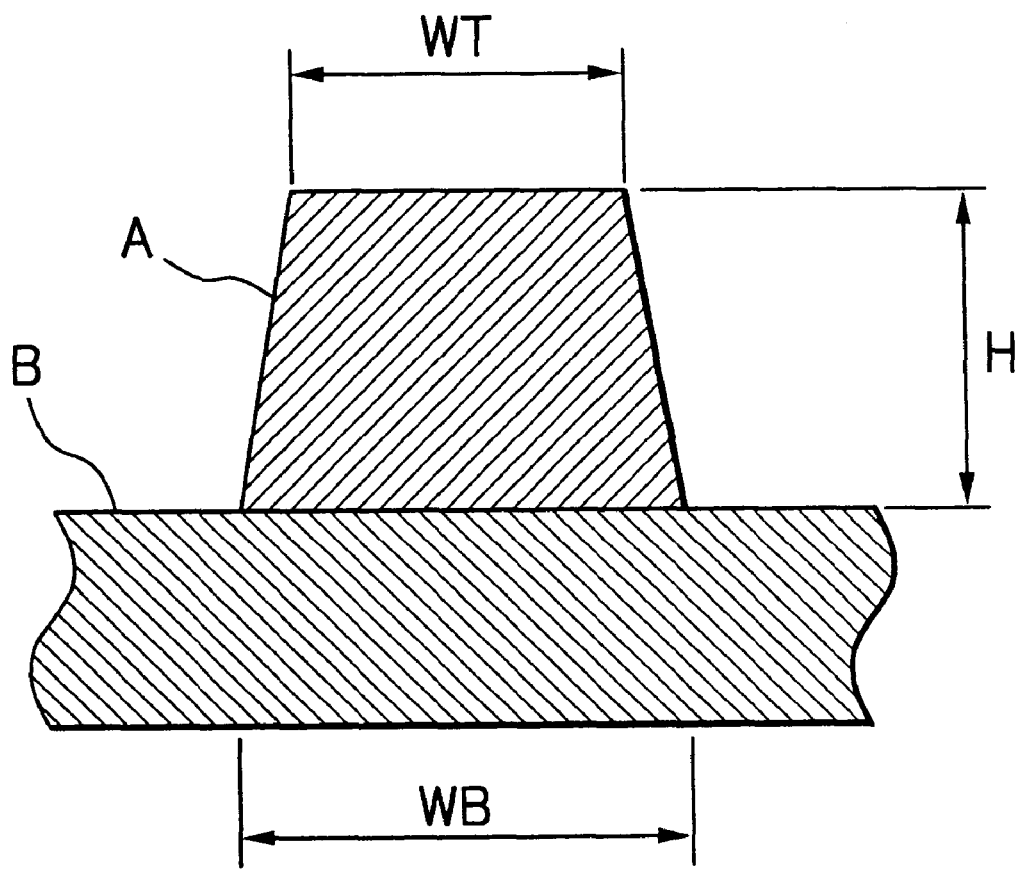
FIG. 1 is an illustrative sectional view of a circuitized copper foil for explaining etching factor.

A preferred example of the copper foil (raw copper foil) to be used in the present invention is electrolytic copper foil. It is also possible to use other ones, such as rolled copper foil or plastic film coated with copper film by, for example, vacuum plating. There is no particular limitation in the thickness of the copper foil and the roughness and form of the surfaces of the copper foil. The copper foil may have a bonding surface on one or each side.

The bonding surface of the raw copper foil is coated with a composite metal layer, which comprises (I) preferably 1,000 to 10,000 $\mu g/dm^2$ of copper, (II) preferably 10 to 1,000 $\mu g/dm^2$, more preferably 10 to 200 $\mu g/dm^2$ of at least one metal selected from the group consisting of tungsten and molybdenum and (III) preferably 1 to 1,000 $\mu g/dm^2$, more preferably 5 to 300 $\mu g/dm^2$, further preferably 10 to 50 $\mu g/dm^2$ of at least one metal selected from the group consisting of nickel, cobalt, iron and zinc, all in coating amount.

If the coating amount of the at least one metal selected from the group consisting of nickel, cobalt, iron and zinc is less than 1 $\mu g/dm^2$, the nodular copper cannot be formed uniformly by the plating, but be centered to the convexes, and if more than 1,000 $\mu g/dm^2$, etching the plated layer may take a very long time to remove unnecessary copper to form copper circuits. The coating amount of the at least one metal selected from the group consisting of nickel, cobalt, iron and zinc depends on the composition of the plating bath and the treating conditions, which may be selected from those described later.

If the coating amount of copper in the composite metal layer is less than 1,000 $\mu g/dm^2$, the nodular copper may not be formed uniformly, and if more than 10,000 $\mu g/dm^2$, the uniform formation of the nodular copper may be less effective and the production cost may increase. If the coating amount of the at least one metal selected from the group consisting of tungsten and molybdenum in the composite metal layer is less than 10 $\mu g/dm^2$, nodular copper may not be formed uniformly, and if more than 1,000 $\mu g/dm^2$, the nodular copper may not grow large. The composite metal layer is preferably 0.01 to 0.15 $\mu m$ thick.

According to the present invention, the composite metal layer is formed by treating the bonding surface of a copper foil as a cathode by electrolysis in a plating bath (A) containing (1) copper ions, (2) metal ions of at least one metal selected from the group consisting of tungsten and molybdenum, (3) metal ions of at least one metal selected from the group consisting of nickel, cobalt, iron and zinc and (4) 1 to 100 mg/l of chloronium ions, at a current density lower than the limiting current density of the plating bath. The bonding surface of the copper foil is preferably pickled and degreased prior to the electrolysis.

The sources of the metal ions in the plating bath (A) are water-soluble metal salts. The following is a non-limitative but preferred range of the composition of the bath.

(1) copper ion concentration: 5–25 g/l (copper ion source—copper sulfate pentahydrate)

(2-1) tungsten ion concentration: 0.006–11 g/l (tungsten ion source—sodium tungstate dehydrate)

(2-2) molybdenum ion concentration: 0.2–8 g/l (molybdenum ion source—sodium molybdate dihydrate)

(2-3) the total concentration of tungsten ions and molybdenum ions: 0.006–11 g/l (3-1) nickel ion concentration: 2–22 g/l (nickel ion source—nickel sulfate hexahydrate)

(3-2) cobalt ion concentration: 2–21 g/l (cobalt ion source—cobalt sulfate heptahydrate)

(3-3) iron ion concentration: 3–28 g/l (iron ion source—ferrous sulfate heptahydrate)

(3-4) zinc ion concentration: 3–29 g/l (zinc ion source—zinc sulfate heptahydrate)

(3-5) the total concentration of nickel ions, cobalt ions, iron ions and zinc ions: 2–30 g/l (4) chloronium ion concentration: 1–100 mg/l (chloronium ion source—hydrochloric acid, sodium chloride)

If the chloronium ion concentration is less than 1 mg/l, the roughened layer comprising copper formed on the composite metal layer may have a large surface roughness, and the etching factor (Ef) may be decreased. If it is more than 100 mg/l, due to the excessive effects of chloronium ions, the surface roughness of the roughened layer comprising copper may become too small to have anchor effect to resin base materials, decreasing adhesive strength. The chloronium ion concentration in the plating bath is preferably 2 to 85 mg/l.

So far as the current density is lower than the limiting current density of the plating bath (A), the electrolysis conditions suitable for forming the composite metal layer are not limited, and are generally selected from the following ranges.

current density: 1–10 $A/dm^2$ electrolysis treatment period: 1–30 sec.

bath temperature: 10–60° C.

If the current density is lower than 1 $A/dm^2$, for example, the roughened layer comprising copper made by the subsequent roughening treatment in a sulfuric acid-acidic plating bath may also have a large surface roughness, and the etching factor (Ef) may become too small to form fine wiring pattern. If it is more than 10 A/dm², the surface roughness of the roughened layer comprising copper may become too small to have anchor effect, decreasing adhesive strength.

The preferred pH of the plating bath (A) ranges from 1.5 to 5.0. If the pH is lower than 1.5, the coating amounts of the at least one metal selected from the group consisting of tungsten and molybdenum and the at least one metal selected from the group consisting of nickel, cobalt, iron and zinc in the composite layer may be outside the preferred ranges, so that the formation of nodular copper by the plating does not extend to the concaves on the raw copper foil but be centered on the convexes. If the pH is higher than 5.0, it may take a very long time to dissolve the metal ions of at least one metal selected from tungsten and molybdenum, lowering the productivity. The pH more preferably ranges from 2.0 to 4.0.

By forming the composite metal layer, fine particles are formed on the bonding surface of the copper foil, but may give insufficient adhesive strength as they are or even after coated with copper by burning plating or covering plating. To improve adhesive strength, a roughened layer comprising copper is formed by forming uniform nodular copper all over the composite metal layer by using both burning plating and covering plating.

That is, the copper foil treated under the above-described conditions is washed with water, and then a roughened layer comprising copper is formed on the composite metal layer by carrying out burning plating whereby a dendritic copper electrodeposition layer is formed by electrolysis in a plating bath (B) containing copper ions at a current density not lower than the limiting current density of the plating bath (B), followed by covering plating whereby nodular copper is formed by electrolysis at a current density lower than the limiting current density of the plating bath (B).

The coating amount of copper in the roughened layer comprising copper is preferably 30,000 to 300,000 $\mu g/dm^2$. If it is less than 30,000 $\mu g/dm^2$, copper nodules may be too small to give sufficient adhesive strength, and if more than 300,000 $\mu g/dm^2$, adhesive strength may be sufficient, but the production cost will be problematically high. More preferred coating amount is 100,000 to 200,000 $\mu g/dm^2$. The combined step of burning plating/covering plating may be repeated to form the roughened layer comprising copper.

In cases where the roughened layer comprising copper is formed by using a common sulfuric acid-acidic copper sulfate bath, preferred but non-limitative examples of the composition of the bath and electrolysis conditions are as follows.

- copper ion source—copper sulfate pentahydrate: 20–300 g/l (preferred copper ion concentration: 5–76 g/l)
- sulfuric acid: 10–200 g/l
- current density: burning plating (not lower than the limiting current density)—10–200 A/dm²; covering plating (lower than the limiting current density)—1–20 A/dm²
- electrolysis treatment period: burning plating—1–10 seconds; covering plating—40–100 seconds
- bath temperature: 20–60° C.

On the copper foil coated with the roughened layer comprising copper, it is preferable to form other layers commonly formed on copper foil, for example, a rust preventing layer, such as a chromate layer, a zinc layer, a copper-zinc alloy layer, a zinc alloy layer, a nickel-molybdenum-cobalt layer or an indium-zinc layer, a silane coupling agent treatment layer, or an adhesive resin layer, such as a phenolic resin, epoxy resin or polyimide resin layer, according to demands. The roughening-treated copper foil coated with the above-described layers is laminated as a copper foil for fine wiring onto a resin base material with heat and pressure, to form a copper-clad laminate for printed wiring boards.

Hereinafter the present invention will be described in more detail referring to Examples and Comparative Examples, which, however, do not limit the scope of the present invention.

EXAMPLES 1 TO 7 AND COMPARATIVE EXAMPLES 1 TO 7

Example 1

(1) A 12 $\mu$m thick electrolytic copper foil (surface roughness Rz of mat surface: 1.5 $\mu$m as measured according to JIS B 0601) was pickled for 60 seconds by using a 10 wt % sulfuric acid solution.

(2) The copper foil was then washed with water, and the mat surface (bonding surface) of the copper foil was treated by electrolysis at a current density of 3 A/dm² for 8 seconds in a plating bath, which contained 50 g/l of copper sulfate pentahydrate, 2 g/l of sodium molybdate dehydrate, 50 g/l of nickel sulfate hexahydrate and 20 mg/l of chloronium ions (hydrochloric acid was used in all Examples and Comparative Examples, if used) and was adjusted to pH 2.5 and to a bath temperature of 30° C., to form on the bonding surface of the copper foil a composite metal layer containing copper, molybdenum and nickel. The coating amounts of the metals in the composite metal layer were measured by an ICP (inductively coupled plasma luminescent) analyzer to be 7,900 $\mu g/dm^2$ of copper, 110 $\mu g/dm^2$ of molybdenum and 15 $\mu g/dm^2$ of nickel. After the treatment, the treated surface had a surface roughness Rz of 1.5 $\mu$m.

(3) The copper foil was then washed with water, and the surface of the composite metal layer was treated by ① electrolysis at a current density of 30 A/dm² (not lower than the limiting current density) for 3 seconds followed by ② electrolysis at 5 A/dm² (lower than the limiting current density) for 80 seconds both in a plating bath containing 130 g/l of copper sulfate pentahydrate and 100 g/l of sulfuric acid and adjusted to a bath temperature of 30° C., to form a roughened layer comprising copper. The roughened layer comprising copper had a coating amount of copper of 150,000 $\mu g/dm^2$ and a surface roughness Rz of 2.2 $\mu$m. On the roughening-treated electrolytic copper foil was observed nodular copper formed all over the raw copper foil.

(4) The copper foil was then washed with water, and treated by electrolysis at a current density of 0.7 A/dm² for 2.7 seconds in an aqueous solution of 3.5 g/l of sodium bichromate dehydrate adjusted to pH 4.2 and a bath temperature of 30° C., to form a rust preventing layer.

(5) The copper foil was then washed with water, dipped for 10 seconds in an aqueous solution of 0.1 wt % 3-glycidoxypropyltrimethoxysilane, and then immediately dried at 80° C., to form a silane coupling agent treatment layer.

(6) To measure adhesive strength, a copper-clad laminate was produced by laminating the copper foil onto a glass-epoxy resin impregnation base material corresponding to FR-5 under a pressing pressure of 3.8 MPa, at a pressing temperature of 168° C. for a pressing time of 90 minutes, with the bonding surface of the copper foil facing the base material. The adhesive strength between the copper foil and the resin base material was then measured at room temperature according to JIS C 6481 (copper foil width: 1 mm). The result is shown in Table 1.

(7) The copper-clad laminate produced in (6) was used to form fine wiring of 50 μm in circuit width and 50 μm in circuit space. The top width and bottom width of the fine wiring were measured with a metallurgical microscope, and Ef was calculated using the above-described formula. The result is shown in Table 1.

Example 2

After the same electrolytic copper foil as that used in Example 1 was pickled and washed with water in the same manner as in Example 1, the mat surface (bonding surface) of the copper foil was treated by electrolysis at a current density of 3 A/dm² for 8 seconds in a plating bath, which contained 50 g/l of copper sulfate pentahydrate, 2 g/l of sodium molybdate dehydrate, 30 g/l of cobalt sulfate heptahydrate, 30 g/l of ferrous sulfate heptahydrate and 40 mg/l of chloronium ions and was adjusted to pH 2.0 and to a bath temperature of 30° C., to form on the bonding surface of the copper foil a composite metal layer containing copper, molybdenum, cobalt and iron. The coating amounts of the metals in the composite metal layer were measured by an ICP (inductively coupled plasma luminescent) analyzer to be 7,900 μg/dm² of copper, 60 μg/dm² of molybdenum, 12 μg/dm² of cobalt and 11 μg/dm² of iron. After the treatment, the treated surface had a surface roughness Rz of 1.5 μm. Subsequently, a roughened layer comprising copper was formed in the same manner as in Example 1. The roughened layer comprising copper had a coating amount of copper of 150,000 μg/dm² and a surface roughness Rz of 2.3 μm. On the roughening-treated electrolytic copper foil was observed nodular copper formed all over the raw copper foil.

After the treatments (4) and (5) of Example 1 were carried out, the measurement of adhesive strength and calculation of Ef were carried out in the same manner as in (6) and (7) of Example 1, respectively. The results are shown in Table 1.

Example 3

After the same electrolytic copper foil as that used in Example 1 was pickled and washed with water in the same manner as in Example 1, the mat surface (bonding surface) of the copper foil was treated by electrolysis at a current density of 4 A/dm² for 6 seconds in a plating bath, which contained 50 g/l of copper sulfate pentahydrate, 2 g/l of sodium molybdate dehydrate, 50 g/l of zinc sulfate heptahydrate and 5 mg/l of chloronium ions and was adjusted to pH 2.5 and to a bath temperature of 30° C., to form on the bonding surface of the copper foil a composite metal layer containing copper, molybdenum and zinc. The coating amounts of the metals in the composite metal layer were measured by an ICP (inductively coupled plasma luminescent) analyzer to be 7,900 μg/dm² of copper, 130 μg/dm² of molybdenum and 20 μg/dm² of zinc. After the treatment, the treated surface had a surface roughness Rz of 1.5 μm. Subsequently, a roughened layer comprising copper was formed in the same manner as in Example 1. The roughened layer comprising copper had a coating amount of copper of 150,000 μg/dm² and a surface roughness Rz of 2.5 μm. On the roughening-treated electrolytic copper foil was observed nodular copper formed all over the raw copper foil.

After the treatments (4) and (5) of Example 1 were carried out, the measurement of adhesive strength and calculation of Ef were carried out in the same manner as in (6) and (7) of Example 1, respectively. The results are shown in Table 1.

Example 4

After the same electrolytic copper foil as that used in Example 1 was pickled and washed with water in the same manner as in Example 1, the mat surface (bonding surface) of the copper foil was treated by electrolysis at a current density of 4 A/dm² for 6 seconds in a plating bath, which contained 50 g/l of copper sulfate pentahydrate, 2 g/l of sodium tungstate dehydrate, 50 g/l of nickel sulfate hexahydrate and 85 mg/l of chloronium ions and was adjusted to pH 3.0 and to a bath temperature of 30° C., to form on the bonding surface of the copper foil a composite metal layer containing copper, tungsten and nickel. The coating amounts of the metals in the composite metal layer were measured by an ICP (inductively coupled plasma luminescent) analyzer to be 7,900 μg/dm² of copper, 20 μg/dm² of tungsten and 14 μg/dm² of nickel. After the treatment, the treated surface had a surface roughness Rz of 1.5 μm. Subsequently, a roughened layer comprising copper was formed in the same manner as in Example 1. The roughened layer comprising copper had a coating amount of copper of 150,000 μg/dm² and a surface roughness Rz of 2.1 μm. On the roughening-treated electrolytic copper foil was observed nodular copper formed all over the raw copper foil.

After the treatments (4) and (5) of Example 1 were carried out, the measurement of adhesive strength and calculation of Ef were carried out in the same manner as in (6) and (7) of Example 1, respectively. The results are shown in Table 1.

Example 5

After the same electrolytic copper foil as that used in Example 1 was pickled and washed with water in the same manner as in Example 1, the mat surface (bonding surface) of the copper foil was treated by electrolysis at a current density of 2 A/dm² for 8 seconds in a plating bath, which contained 50 g/l of copper sulfate pentahydrate, 10 g/l of sodium tungstate dehydrate, 30 g/l of cobalt sulfate heptahydrate, 30 g/l of ferrous sulfate heptahydrate and 2 mg/l of chloronium ions and was adjusted to pH 2.0 and to a bath temperature of 30° C., to form on the bonding surface of the copper foil a composite metal layer containing copper, tungsten, cobalt and iron. The coating amounts of the metals in the composite metal layer were measured by an ICP (inductively coupled plasma luminescent) analyzer to be 3,900 μg/dm² of copper, 80 μg/dm² of tungsten, 10 μg/dm² of cobalt and 13 μg/dm² of iron. After the treatment, the treated surface had a surface roughness Rz of 1.5 μm. Subsequently, a roughened layer comprising copper was formed in the same manner as in Example 1. The roughened layer comprising copper had a surface roughness Rz of 3.0 μm. On the roughening-treated electrolytic copper foil was observed nodular copper formed all over the raw copper foil.

After the treatments (4) and (5) of Example 1 were carried out, the measurement of adhesive strength and calculation of Ef were carried out in the same manner as in (6) and (7) of Example 1, respectively. The results are shown in Table 1.

Example 6

After the same electrolytic copper foil as that used in Example 1 was pickled and washed with water in the same manner as in Example 1, the mat surface (bonding surface) of the copper foil was treated by electrolysis at a current density of 3 A/dm² for 8 seconds in a plating bath, which contained 50 g/l of copper sulfate pentahydrate, 1 g/l of sodium tungstate dehydrate, 2 g/l of sodium molybdate dihydrate, 50 g/l of zinc sulfate heptahydrate and 10 mg/l of chloronium ions and was adjusted to pH 2.5 and to a bath temperature of 30° C., to form on the bonding surface of the copper foil a composite metal layer containing copper, tungsten, molybdenum and zinc. The coating amounts of the metals in the composite metal layer were measured by an ICP (inductively coupled plasma luminescent) analyzer to be 7,900 μg/dm² of copper, 40 μg/dm² of tungsten, 100 μg/dm² of molybdenum and 28 μg/dm² of zinc. After the treatment, the treated surface had a surface roughness Rz of 1.5 μm. Subsequently, a roughened layer comprising copper was formed in the same manner as in Example 1. The roughened layer comprising copper had a surface roughness Rz of 2.3 μm. On the roughening-treated electrolytic copper foil was observed nodular copper formed all over the raw copper foil.

After the treatments (4) and (5) of Example 1 were carried out, the measurement of adhesive strength and calculation of Ef were carried out in the same manner as in (6) and (7) of Example 1, respectively. The results are shown in Table 1.

Example 7

After a 18 μm-thick rolled copper foil (surface roughness Rz: 1.0 μm) was pickled and washed with water in the same manner as in Example 1, the copper foil was treated by electrolysis at a current density of 4 A/dm² for 6 seconds in the same plating bath as that used in Example 4, to form on the bonding surface of the copper foil a composite metal layer containing copper, tungsten and nickel. The coating amounts of the metals in the composite metal layer were 7,900 μg/dm² of copper, 20 μg/dm² of tungsten and 14 μg/dm² of nickel. After the treatment, the treated surface had a surface roughness Rz of 1.0 μm. Subsequently, a roughened layer comprising copper was formed in the same manner as in Example 1. The roughened layer comprising copper had a surface roughness Rz of 1.5 μm.

After the treatments (4) and (5) of Example 1 were carried out, the measurement of adhesive strength and calculation of Ef were carried out in the same manner as in (6) and (7) of Example 1, respectively. The results are shown in Table 1.

Comparative Example 1

The procedures of Example 1 were repeated except that chloronium ions were not added into the plating bath for forming the composite metal layer in (2). The mat surface of the resulting copper foil had a surface roughness Rz of 2.3 μm. The resulting copper foil was used to measure adhesive strength in the same manner as in (6) of Example 1 and to calculate Ef in the same manner as in (7) of Example 1. The results are shown in Table 1.

Comparative Example 2

The procedure of Example 4 was repeated except that chloronium ion concentration in the plating bath for forming the composite metal layer was changed to 150 mg/l. The mat surface of the resulting copper foil had a surface roughness Rz of 2.0 μm. The resulting copper foil was used to measure adhesive strength in the same manner as in (6) of Example 1 and to calculate Ef in the same manner as in (7) of Example 1. The results are shown in Table 1.

Comparative Example 3

The same copper foil as that used in Example 1 was subjected to the treatments of Example 1 (1) and (2), washed with water and then treated by electrolysis at a current density of 30 A/dm² (not lower than the limiting current density) for 3 seconds by using a plating bath, which contained 130 g/l of copper sulfate pentahydrate and 100 g/l of sulfuric acid and was adjusted to a bath temperature of 30° C., to form a dendritic copper layer (burning plating).

The dendritic copper layer had a coating amount of copper of 18,000 μg/dm², and the mat surface of the resulting copper foil had a surface roughness Rz of 2.2 μm.

After the treatments (4) and (5) of Example 1 were carried out, adhesive strength was measured in the same manner as in (6) of Example 1. The result is shown in Table 1. Fine wiring was formed in the same manner as in (7) of Example 1, but Ef could not be calculated, because much residual copper was observed between circuits.

Comparative Example 4

The same copper foil as that used in Example 1 was subjected to the treatments of (1) and (2) of Example 1, washed with water and then treated by electrolysis at a current density of 5 A/dm² (lower than the limiting current density) for 80 seconds by using a plating bath, which contained 130 g/l of copper sulfate pentahydrate and 100 g/l of sulfuric acid and was adjusted to a bath temperature of 30° C., to form a smooth copper layer (covering plating). The smooth copper layer had a coating amount of copper of 132,000 μg/dm², and the mat surface of the resulting copper foil had a surface roughness Rz of 2.0 μm.

After the treatments (4) and (5) of Example 1 were carried out, adhesive strength was measured in the same manner as in (6) of Example 1, and Ef was calculated in the same manner as in (7) of Example 1. The results are shown in Table 1.

Comparative Example 5

The same electrolytic copper foil as that used in Example 1 was pickled and washed with water in the same manner as in Example 1. Without forming a composite metal layer, the mat surface (bonding surface) of the copper foil was then treated in a plating bath of a bath temperature of 30° C. containing 130 g/l of copper sulfate pentahydrate and 100 g/l of sulfuric acid by ① electrolysis at a current density of 30 A/dm² (not lower than the limiting current density) for 3 seconds and ② electrolysis at a current density of 5 A/dm² (lower than the limiting current density) for 80 seconds, to form a roughened layer comprising copper. The roughened layer comprising copper had a coating amount of copper of 150,000 μg/dm², and the mat surface had a surface roughness Rz of 4.5 μm.

After the treatments (4) and (5) of Example 1 were carried out, adhesive strength was measured in the same manner as in (6) of Example 1, and Ef was calculated in the same manner as in (7) of Example 1. The results are shown in Table 1.

Comparative Example 6

The same rolled copper foil as that used in Example 7 was pickled and washed with water in the same manner as in Example 1. Without forming a composite metal layer, the mat surface (bonding surface) of the copper foil was then treated in a plating bath of a bath temperature of 30° C. containing 130 g/l of copper sulfate pentahydrate and 100 g/l of sulfuric acid by ① electrolysis at a current density of 30 A/dm² (not lower than the limiting current density) for 3 seconds and ② electrolysis at a current density of 5 A/dm² (lower than the limiting current density) for 80 seconds, to form a roughened layer comprising copper. The roughened layer comprising copper had a coating amount of copper of 150,000 μg/dm², and the mat surface had a surface roughness Rz of 4.0 μm.

After the treatments (4) and (5) of Example 1 were carried out, adhesive strength was measured in the same manner as in (6) of Example 1, and Ef was calculated in the same manner as in (7) of Example 1. The results are shown in Table 1.

Comparative Example 7

The same electrolytic copper foil as that used in Example 1 was pickled and washed with water in the same manner as in Example 1. Without forming a composite metal layer, the mat surface (bonding surface) of the copper foil was then treated by ① electrolysis in a plating bath of a bath temperature of 35° C. containing 100 g/l of copper sulfate pentahydrate, 120 g/l of sulfuric acid, 0.6 g/l of sodium tungstate dihydrate and 15 g/l of ferrous sulfate heptahydrate at a current density of 40 A/dm$^2$ (not lower than the limiting current density) for 3.5 seconds and ② electrolysis in a plating bath of a bath temperature of 50° C. containing 250 g/l of copper sulfate pentahydrate and 100 g/l of sulfuric acid at a current density of 5 A/dm$^2$ (lower than the limiting current density) for 80 seconds, to form a roughened copper layer containing tungsten and iron. The mat surface of the resulting copper foil had a surface roughness Rz of 3.8 μm.

After the treatments (4) and (5) of Example 1 were carried out, adhesive strength was measured in the same manner as in (6) of Example 1, and Ef was calculated in the same manner as in (7) of Example 1. The results are shown in Table 1.

TABLE 1

|  | Surface roughness of roughened surface (Rz, μm) | Etching factor (Ef) | Adhesive strength (kN/m) |
|---|---|---|---|
| Example 1 | 2.2 | 5.5 | 1.01 |
| Example 2 | 2.3 | 5.2 | 1.06 |
| Example 3 | 2.5 | 4.8 | 1.10 |
| Example 4 | 2.1 | 5.6 | 1.00 |
| Example 5 | 3.0 | 4.5 | 1.15 |
| Example 6 | 2.3 | 5.4 | 1.03 |
| Example 7 | 1.5 | 4.7 | 1.05 |
| Comparative Example 1 | 2.3 | 5.4 | 0.90 |
| Comparative Example 2 | 2.0 | 6.0 | 0.75 |
| Comparative Example 3 | 2.2 | — | 0.90 |
| Comparative Example 4 | 2.0 | 6.1 | 0.50 |
| Comparative Example 5 | 4.5 | 2.0 | 1.02 |
| Comparative Example 6 | 4.0 | 2.3 | 0.93 |
| Comparative Example 7 | 3.8 | 3.5 | 0.95 |

The copper foils for fine wiring produced in Examples 1–7 had surface roughnesses Rz of as small as 3.0 μm or less on the side of roughened surfaces, and maintained adhesive strengths of 1.0 kN/m or more. Further, their Ef values were higher than those of Comparative Examples having similar adhesive strengths, and formed fine wiring patterns of good shapes. No residual copper particles were observed on the side of base materials in Examples, while residual copper particles were observed in Comparative Examples 3, 5 and 6.

The copper-clad laminates produced by lamination using the copper foils for fine wiring are suitable for the production of printed wiring boards having high density wiring.

According to the method of the present invention, copper foil for fine wiring having good etching properties can be obtained, while ensuring practical adhesive strength against resin base materials. Therefore, fine wiring circuits can be formed by producing various copper-clad laminates by using the resulting copper foil and forming printed circuits.

What is claimed is:

1. A method of producing a copper foil for fine wiring, comprising treating a copper foil as a cathode by electrolysis in a plating bath (A) containing (1) copper ions, (2) metal ions of at least one metal selected from the group consisting of tungsten and molybdenum, (3) metal ions of at least one metal selected from the group consisting of nickel, cobalt, iron and zinc and (4) 1 to 100 mg/l of chloronium ions, at a current density lower than a limiting current density of the plating bath (A), to form on a bonding surface of the copper foil a composite metal layer comprising (I) copper, (II) at least one metal selected from the group consisting of tungsten and molybdenum and (III) at least one metal selected from the group consisting of nickel, cobalt, iron and zinc; and forming a roughened layer comprising copper on the composite metal layer by carrying out electrolysis in a plating bath (B) containing copper ions at a current density not lower than a limiting current density of the plating bath (B) to form a dendritic copper electrodeposition layer and then carrying out subsequent electrolysis at a current density lower than the limiting current density of the plating bath (B) to form nodular copper.

2. The method of claim 1, wherein the plating bath (A) contains 5 to 25 g/l of copper ions, 0.006 to 11 g/l of total of tungsten ions and molybdenum ions, 2 to 30 g/l of total of nickel ions, cobalt ions, iron ions and zinc ions and 1 to 100 mg/l of chloronium ions and is adjusted to pH 1.5 to 5.0, and the plating bath (B) contains 5 to 76 g/l of copper ions.

* * * * *